United States Patent
Hutchings et al.

(10) Patent No.: US 10,296,119 B2
(45) Date of Patent: May 21, 2019

(54) PRINTED CIRCUIT BOARD

(71) Applicant: HEWLETT-PACKARD DEVELOPMENT COMPANY, L.P., Houston, TX (US)

(72) Inventors: Cameron Hutchings, Boise, ID (US); Stewart R. Wyatt, Boise, ID (US); Scott David Hahn, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 39 days.

(21) Appl. No.: 15/547,796

(22) PCT Filed: Mar. 31, 2015

(86) PCT No.: PCT/US2015/023705
§ 371 (c)(1),
(2) Date: Jul. 31, 2017

(87) PCT Pub. No.: WO2016/159995
PCT Pub. Date: Oct. 6, 2016

(65) Prior Publication Data
US 2018/0024676 A1    Jan. 25, 2018

(51) Int. Cl.
*G06F 3/041* (2006.01)
*H05K 1/02* (2006.01)
*G06F 3/042* (2006.01)

(52) U.S. Cl.
CPC .......... *G06F 3/0412* (2013.01); *G06F 3/041* (2013.01); *G06F 3/0421* (2013.01); *H05K 1/0274* (2013.01); *G06F 2203/04103* (2013.01); *H05K 2201/09036* (2013.01); *H05K 2201/09154* (2013.01); *H05K 2201/10106* (2013.01); *H05K 2201/10121* (2013.01)

(58) Field of Classification Search
CPC ...... G06F 3/0412; G06F 3/0421; G06F 3/042; G06F 3/041; H05K 1/0274; H05K 2201/09036; H05K 2201/10121
USPC ............................................... 345/175
See application file for complete search history.

(56) References Cited

U.S. PATENT DOCUMENTS

| 9,651,729 B2 * | 5/2017 | Nichol | G02B 6/0036 |
| 9,915,770 B2 * | 3/2018 | Hirayama | G02B 6/0038 |
| 2009/0136192 A1 | 5/2009 | Shimizu | |

(Continued)

FOREIGN PATENT DOCUMENTS

| CN | 2613055 | 4/2004 |
| CN | 101034216 | 9/2007 |

(Continued)

OTHER PUBLICATIONS

Feltges, Harry, "Optical Touchscreens Benefit from Compact High-Power Infrared LEDS", Sep. 2013, 6 pages.

*Primary Examiner* — Fred Tzeng
(74) *Attorney, Agent, or Firm* — HP Inc. Patent Department

(57) ABSTRACT

According to an example, a device may comprise a touchscreen light guide assembly, a lens disposed on the touchscreen light guide assembly, and a printed circuit board including a relief cut on an edge of the printed circuit board. The relief cut may be to receive the touchscreen light guide assembly and to allow the lens to extend into the printed circuit board relief cut.

15 Claims, 3 Drawing Sheets

(56) References Cited

U.S. PATENT DOCUMENTS

| | | | |
|---|---|---|---|
| 2009/0146967 A1* | 6/2009 | Ino | G02F 1/133526 345/173 |
| 2010/0290246 A1 | 11/2010 | Kim et al. | |
| 2011/0037717 A1 | 2/2011 | Yeh et al. | |
| 2011/0065480 A1 | 3/2011 | Kim et al. | |
| 2011/0242039 A1 | 10/2011 | Kalis et al. | |
| 2011/0261276 A1* | 10/2011 | Yu | G02B 6/0028 349/16 |
| 2012/0057367 A1 | 3/2012 | Park | |
| 2012/0249438 A1* | 10/2012 | Kim | G06F 3/0412 345/173 |
| 2012/0281273 A1* | 11/2012 | Shinkai | G02F 1/133615 359/315 |
| 2013/0106783 A1 | 5/2013 | Shang et al. | |
| 2013/0153272 A1 | 6/2013 | Chiu et al. | |
| 2014/0016348 A1* | 1/2014 | Iwasaki | G02B 6/0041 362/606 |
| 2014/0049983 A1* | 2/2014 | Nichol | G02B 6/0018 362/610 |
| 2015/0009457 A1 | 1/2015 | Kubota | |
| 2016/0054507 A1* | 2/2016 | Hirayama | G02B 6/0053 349/65 |
| 2016/0054508 A1* | 2/2016 | Hirayama | G02B 6/0038 349/65 |
| 2016/0092030 A1* | 3/2016 | Byun | G06F 3/046 345/175 |

FOREIGN PATENT DOCUMENTS

| | | |
|---|---|---|
| CN | 102116907 | 7/2011 |
| TW | 201328439 | 7/2013 |

\* cited by examiner

PRINTED CIRCUIT BOARD

BACKGROUND

Computing systems and electronic devices in general may be sold or configured with one or more varieties of printed circuit boards. Printed circuit boards may be relatively thin, layered substrates upon which integrated circuits and other electronic components may be mounted to form, for example, a printed circuit assembly. In some examples, a printed circuit board or assembly may be paired, mated, or otherwise operable with an input sensor, such as a touchscreen for receiving input from, for example, a fingertip or stylus.

SUMMARY

Figure 1:
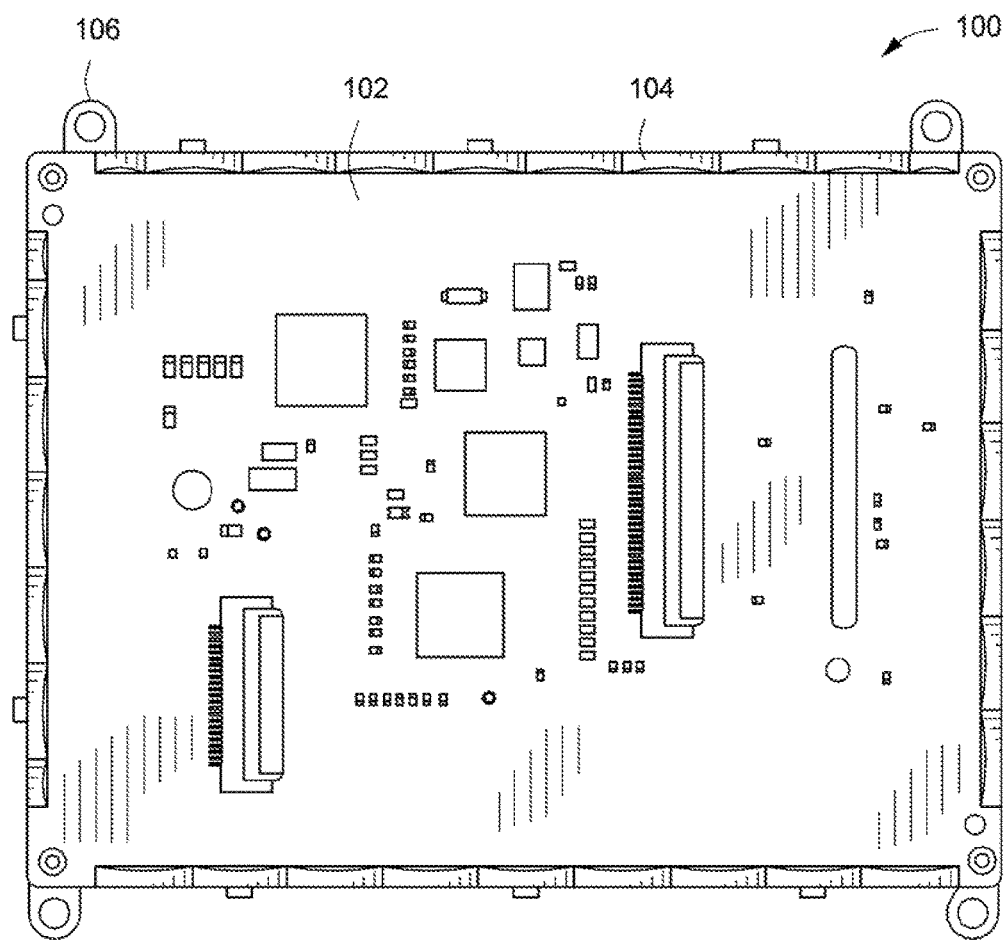
FIG. 1 illustrates a printed circuit board mated to a light guide, according to an example of the present disclosure.

Some examples provided herein may comprise a device comprising a touchscreen light guide assembly, a lens disposed on the touchscreen light guide assembly, and a printed circuit board including a relief cut on an edge of the printed circuit board to receive the touchscreen light guide assembly and to allow the lens to extend into the printed circuit board relief cut.

Some examples provided herein may comprise a printed circuit board comprising a printed circuit layer, an alignment pin to align a touchscreen light guide to the printed circuit layer, and a mounting edge with a milled channel to allow the touchscreen light guide to mate with the printed circuit board with clearance for a touchscreen light guide lens to protrude into the milled channel.

Some examples provided herein may comprise a method comprising manufacturing a printed circuit board including a photodiode, a light source, and a layer with a channel to receive a touchscreen light guide assembly, manufacturing the touchscreen light guide assembly, and mating the printed circuit board to the touchscreen light guide assembly using an alignment pin.

DETAILED DESCRIPTION

Various examples described below relate to a printed circuit board ("PCB") and a touchscreen light guide with a lens or lenses, which may be of varying height. In an example, an edge or edges of the printed circuit board may be milled, scored, machined, channeled, relief-cut, or otherwise altered to allow the touchscreen light guide to mate with the printed circuit board, and to eliminate or minimize any constraint between individual light guide lenses and the PCB.

Generally, computing systems and electronic devices such as desktop computers, laptop computers, servers, thin clients, tablets, smartphones, digital video recorders, retail point of sale devices, and other computing equipment (hereinafter "device" or "devices") may comprise a printed circuit board. As discussed above, PCBs may be relatively thin, layered substrates upon which integrated circuits and other electronic components may be mounted to form, for example, a printed circuit assembly (or "PCA", used interchangeably herein with "PCB" solely for purposes of this application).

A PCB may include a plurality of electrically conductive and insulating layers arranged in a sandwich-like fashion. Conductive layers generally have conductive paths or traces, which are chemically or mechanically etched out of the bulk conductive layer, thus isolated from one another by insulating material and routed within a plane. These traces are generally designed to electrically contact conductive portions of the electronic components mounted on the PCB, forming electrical interconnects. Insulating layers may electrically isolate conductive layers from one another.

In some devices, such as devices utilizing a touchscreen, a PCA may also include or be mated or coupled to a touchscreen system such as an infrared touch system. For example, an infrared touch system may include a light source such as infrared light-emitting diodes ("LEDs") and/or photodiodes or other sensors, which may be positioned proximate to a touchscreen light guide assembly ("light guide").

An optical path may allow light to travel from, for example, the LEDs on a PCB to a light guide, which may direct the light across a touch surface and/or to photodiodes on the opposite side of the PCB. When the surface or screen proximate to a light guide is touched by, for example a fingertip, the light quantity on the photodiodes or other sensors may be decreased, allowing for the detection of an input position on the touch screen system.

The position of the LEDs (relative to the location of lenses on the light guide) may be critical for the entire touchscreen system to function properly at an optimal level. There may be many factors that contribute to degradations in the signal integrity of a touch screen, such as the X-Y position of the PCB relative to the lens, where any slight variation may have an impact, and the alignment of the center of the LEDs and photodiodes with the center of the lenses embedded in the light guide. These components may perform best if aligned in the Z-direction and may have a very small tolerance zone in which they should reside to achieve optimal performance.

In some examples, a light guide may be mated or bolted to a PCB, and more specifically, bolted toward the corners of a PCB such that the mounting hardware used to mate the light guide and PCB is not likely to interfere with the path of light. However, an infrared touch system may include lenses in a light guide of varying height, which may rest against the PCB when the light guide is mated to the PCB and which may cause the PCB and/or light guide to warp, twist, or otherwise be subjected to torsional bending. Any warping of the PCB or light guide may create misalignment between, for example, LEDs, photodiodes, lenses, or other components involved in the touchscreen.

In such cases, the performance or accuracy of the touch screen system may be impacted or even entirely disrupted, i.e., the optical system may be out of alignment resulting in electrical conversion signal measurements beyond an acceptable threshold for operation. Defects or issues resulting from the touch screen system may result in significant manufacturing yield losses, and may require costly and time-consuming work by a technician in a factory or in the field, which may result in other issues from, for example, product handling, dusty environments, and/or temperature exposure.

According to an example described herein, a device may comprise a touchscreen light guide assembly, a lens disposed on the touchscreen light guide assembly, and a printed circuit board including a relief cut on an edge of the printed circuit board. The relief cut may be to receive the touchscreen light guide assembly and to allow the lens to extend into the printed circuit board relief cut, i.e., to eliminate mechanical interference between a PCB and a light guide to align the optical centers of the light guide lenses and the LEDs in order to optimize infrared light performance FIG. 1 illustrates a printed circuit board mated to a light guide, according to an example of the present disclosure. PCB 102 may comprise a plurality of layers, such as conductive layers and/or insulating layers, as discussed below in more detail with respect to FIG. 4.

Generally, conductive layers such as those in PCB 102 may be made of a metal with a high electrical conductivity, such as copper (Cu) or tungsten (W). These metallic conductive layers may be used to provide power and ground planes for components positioned on PCB 102, or may be patterned to form conductive paths, such as traces and pads, which enable signals to flow from one point of PCB 102 to another. Insulating layers may be disposed between conductive layers to surround, for example, traces and pads to prevent contact between each other.

PCB 102 may also comprise components such as a processor, memory, and information storage devices coupled to the PCB 102 to form a PCA, as discussed above. In general, PCB 102 may provide a base for interconnecting semiconductor components, input/output connectors and/or other electronic components.

In an example, the edges of PCB 102 may be milled, etched, relief-cut, or otherwise altered to create a channel in which light guide 104, or a lens or lenses of light guide 104, may rest or protrude into such that the lenses do not physically contact the PCB 102. In some examples, the depth of the channel may be less than the depth of the PCB 102, i.e., the PCB 102 may retain its original shape. In other examples, the depth of the channel may be equal to the depth of the PCB 102, i.e., the shape of the PCB 102 may be altered such that a corner or corners of the PCB protrude past recessed edges.

Figure 2:
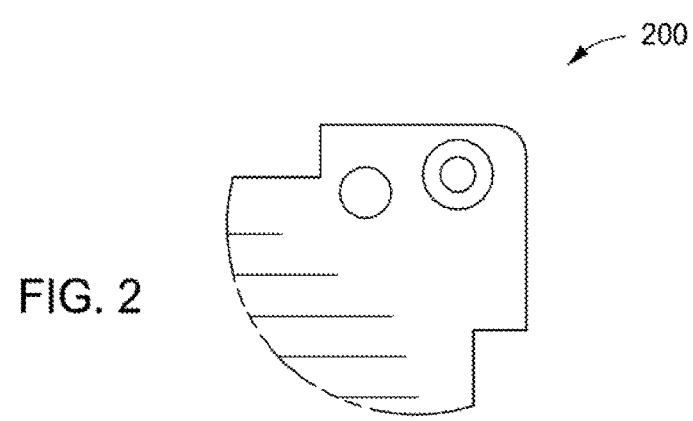
FIG. 2 illustrates a corner of a printed circuit board including a mounting hole, according to an example of the present disclosure.

FIG. 2 illustrates a corner of a printed circuit board including a mounting hole which may provide a coplanar surface, according to an example of the present disclosure. In the example of FIG. 2, a PCB 200 is shown with a channel that has been cut out completely, i.e., the channel is equal to the depth of the PCB 200. For purposes of illustration of the edges and corners of PCB 200, a light guide is not shown in FIG. 2.

Figure 3:
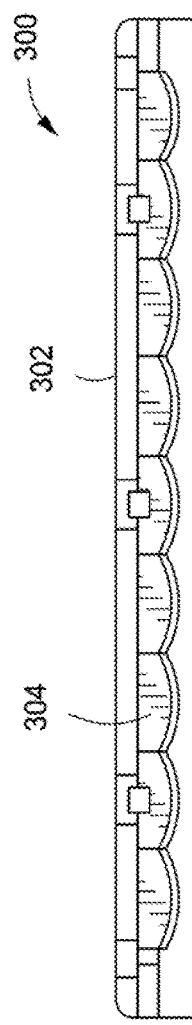
FIG. 3 illustrates a side view of a printed circuit board mated to a light guide, according to an example of the present disclosure.

FIG. 3 illustrates a side view of a printed circuit board mated to a light guide, according to an example of the present disclosure. In FIG. 3, light guide 304 is mated to PCB 306. According to an example, light guide 304 and/or PCB 306 are also mated to a cover 302. In some examples, cover 302 may be a display or display cover for a touchscreen display.

Figure 4:
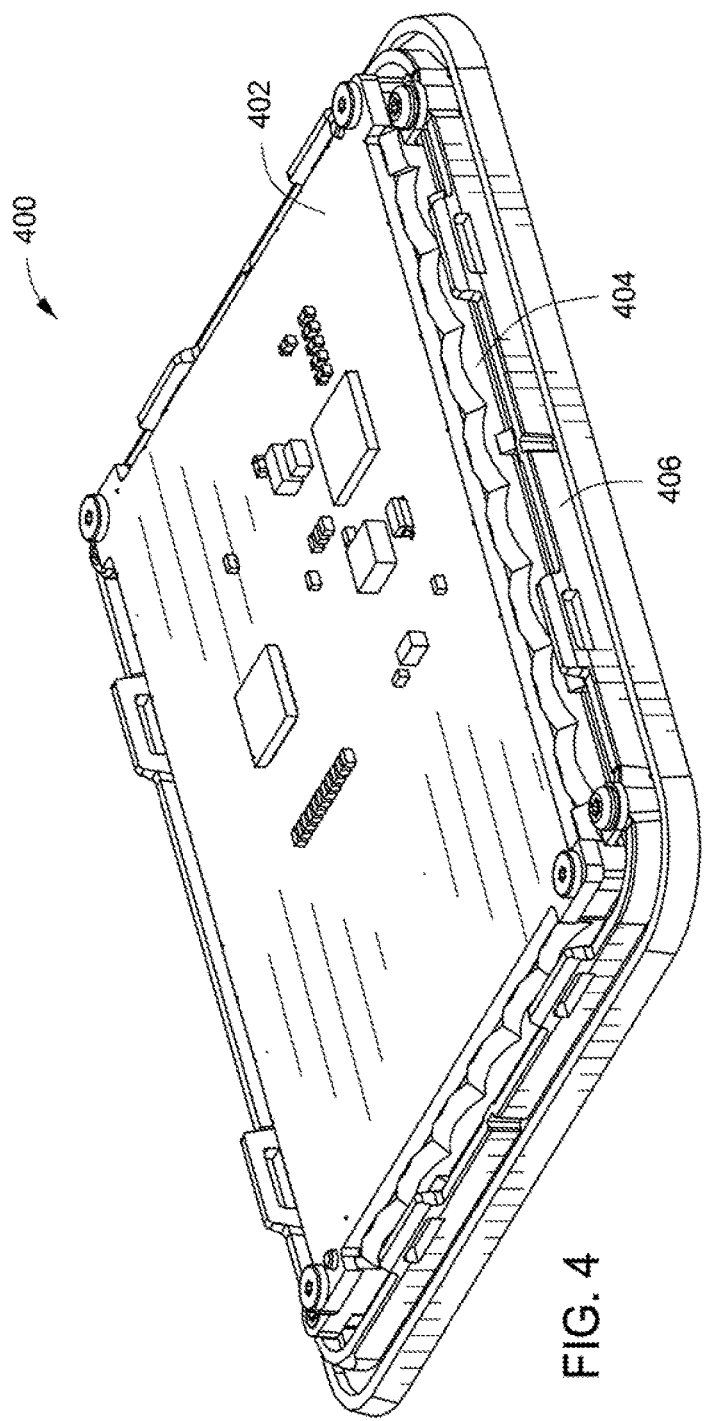
FIG. 4 illustrates a perspective view of a printed circuit board mated to a light guide, according to an example of the present disclosure.

FIG. 4 illustrates a perspective view of a printed circuit board mated to a light guide, according to an example of the present disclosure. In the example of FIG. 4, PCB 402 is mated to light guide 404 and housed within cover 406. As illustrated in FIG. 4, the light guide lenses of light guide 404 protrude into the relief cut of PCB 402, thereby eliminating or minimizing any constraint between the lenses and the PCB that would otherwise result in warping of either part, or the need for lenses of a lesser height.

Figure 5:
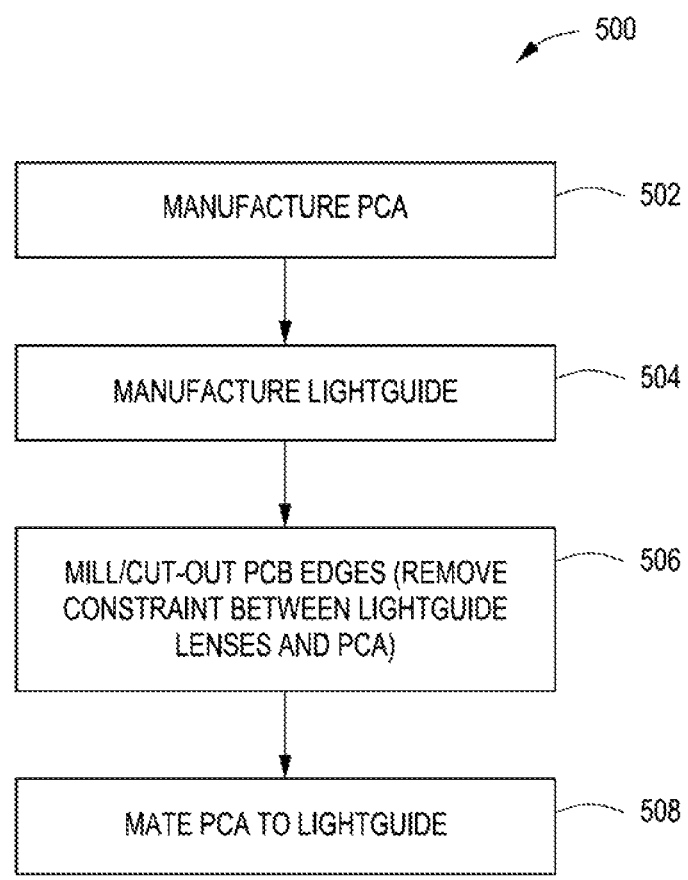
FIG. 5 illustrates a flowchart of manufacturing a printed circuit board, according to an example of the present disclosure.

FIG. 5 illustrates a flowchart of manufacturing a printed circuit board, according to an example of the present disclosure.

In block 502, a PCB is manufactured. A PCB may comprise a layer or a combination of layers. In an example, the first layer may be a metal, e.g., a copper layer, while another layer may be, e.g., fiberglass. In some examples, the edges of the PCB are milled, etched, relief-cut, or otherwise altered to allow the light guide to freely mate with the PCB, without constraint between the PCB and the light guide lenses or light guide assembly in general.

In block 504, a light guide is manufactured. A light guide may be made of, e.g., a plastic or metal material suitable for mating with a PCB.

In block 506, as discussed above and if not part of block 502 already, the edges of the PCB are milled, etched, relief-cut, or otherwise altered.

In block 508, the PCB is mated to the light guide. As discussed above, in some examples, the PCB and light guide may also be mated to a display, a display cover, or other components.

The above discussion is meant to be illustrative of the principles and various embodiments of the present disclosure. Numerous variations and modifications will become apparent once the above disclosure is fully appreciated. It is intended that the following claims be interpreted to embrace all such variations and modifications.

What is claimed is:

1. A device, comprising:
   a touchscreen light guide assembly;
   a lens disposed on the touchscreen light guide assembly; and
   a printed circuit board including a relief cut on an edge of the printed circuit board to receive the touchscreen light guide assembly and to allow the lens to extend into the printed circuit board relief cut.

2. The device of claim 1, wherein the relief cut comprises a depth less than a full depth of the printed circuit board.

3. The device of claim 1, wherein the relief cut comprises a depth equal to the full depth of the printed circuit board.

4. The device of claim 1, wherein the printed circuit board further includes a mounting hole to mate the printed circuit board and the touchscreen light guide assembly.

5. The device of claim 4, wherein the mounting hole is to provide a coplanar mounting surface for the printed circuit board.

6. The device of claim 1, wherein the printed circuit board further includes a photodiode.

7. The device of claim 1, wherein the relief cut is milled or scored.

8. The device of claim 1, including a cover to conceal the printed circuit board and the touchscreen light guide assembly.

9. A printed circuit board, comprising:
   a printed circuit layer;
   an alignment pin to align a touchscreen light guide to the printed circuit layer; and
   a mounting edge with a milled channel to allow the touchscreen light guide to mate with the printed circuit board with clearance for a touchscreen light guide lens to protrude into the milled channel.

10. The printed circuit board of claim 9, wherein the milled channel is machined into the printed circuit board.

11. The printed circuit board of claim 9, wherein the depth of the milled channel is greater than the height of the touchscreen light guide lens.

12. A method, comprising:
   manufacturing a printed circuit board including a photodiode, a light source, and a layer with a channel to receive a touchscreen light guide assembly;
   manufacturing the touchscreen light guide assembly; and
   mating the printed circuit board to the touchscreen light guide assembly using an alignment pin.

13. The method of claim 12, wherein the channel is milled.

14. The method of claim 12, wherein the channel is scored.

15. The method of claim 12, wherein mating the printed circuit board to the touchscreen light guide assembly includes aligning a lens of the touchscreen light guide assembly into the channel without physical contact between the printed circuit board and the lens.

* * * * *